United States Patent
Lin et al.

(10) Patent No.: US 11,868,202 B2
(45) Date of Patent: *Jan. 9, 2024

(54) GRANULAR ERROR REPORTING ON MULTI-PASS PROGRAMMING OF NON-VOLATILE MEMORY

(71) Applicant: MICRON TECHNOLOGY, INC., Boise, ID (US)

(72) Inventors: Qisong Lin, El Dorado Hils, CA (US); Vamsi Pavan Rayaprolu, San Jose, CA (US); Jiangang Wu, Milpitas, CA (US); Sampath K. Ratnam, Boise, ID (US); Sivagnanam Parthasarathy, Carlsbad, CA (US); Shao Chun Shi, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/946,328

(22) Filed: Sep. 16, 2022

(65) Prior Publication Data
US 2023/0012978 A1    Jan. 19, 2023

Related U.S. Application Data

(63) Continuation of application No. 15/733,561, filed as application No. PCT/CN2019/102055 on Aug. 22, 2019, now Pat. No. 11,461,158.

(51) Int. Cl.
*G06F 11/00* (2006.01)
*G06F 11/07* (2006.01)

(52) U.S. Cl.
CPC ........ *G06F 11/0772* (2013.01); *G06F 11/073* (2013.01); *G06F 11/0751* (2013.01)

(58) Field of Classification Search
None
See application file for complete search history.

(56) References Cited

U.S. PATENT DOCUMENTS 8,964,467 B1    2/2015  Dusija et al.
9,218,874 B1   12/2015  Koh et al.
(Continued)

FOREIGN PATENT DOCUMENTS

CN       1049232951 A    9/2017

OTHER PUBLICATIONS

Google Scholar/Patents search—text refined (Year: 2023).*
(Continued)

*Primary Examiner* — Christopher S McCarthy
(74) *Attorney, Agent, or Firm* — Lowenstein Sandler LLP

(57) ABSTRACT

A system includes a memory component to, upon completion of second pass programming in response to a multi-pass programming command, write a plurality of flag bits within a group of memory cells programmed by the multi-pass programming command. The system also includes a processing device, operatively coupled to the memory component. The processing device is to detect an error in attempting to read a top page of the group of memory cells, determine a number of first values within the plurality of flag bits, and in response to the number of first values not satisfying a threshold criterion, report, to a host computing device, an uncorrectable data error due to the top page of the group of memory cells being incompletely programmed.

20 Claims, 7 Drawing Sheets

(56) References Cited

U.S. PATENT DOCUMENTS

| | | | |
|---|---|---|---|
| 9,703,494 B1 | 7/2017 | Rajwade et al. | |
| 11,461,158 B2* | 10/2022 | Lin | G06F 11/0751 |
| 2007/0297226 A1 | 12/2007 | Mokhlesi | |
| 2008/0084739 A1 | 4/2008 | Chae et al. | |
| 2017/0371565 A1 | 12/2017 | Liu et al. | |
| 2019/0278655 A1* | 9/2019 | Koudele | G06F 11/1048 |
| 2020/0233608 A1 | 7/2020 | Kim | |
| 2020/0234780 A1* | 7/2020 | Papandreou | G11C 16/3418 |
| 2021/0043263 A1 | 2/2021 | Zhang | |

OTHER PUBLICATIONS

International Search Report and Written Opinion for International Application No. PCT/CN2019/102055, dated May 21, 2020, 9 pages.
Google Scholar/Patents—text refined (Year: 2021).

\* cited by examiner

300

```
┌─────────────────────────────────────────────────────────────┐
│ Memory component writes multiple flag bits within a group   │
│ of memory cells in response to completion of second pass    │
│ programming.                                                │
│                          310                                │
└─────────────────────────────────────────────────────────────┘
                              │
                              ▼
┌─────────────────────────────────────────────────────────────┐
│ Upon receipt of read request, determine that second logical │
│ address within read request does not match the logical      │
│ address associated with data stored at a physical address   │
│ of group of memory cells.                                   │
│                          320                                │
└─────────────────────────────────────────────────────────────┘
                              │
                              ▼
┌─────────────────────────────────────────────────────────────┐
│ Determine number of first values within the multiple flag   │
│ bits.  330                                                  │
└─────────────────────────────────────────────────────────────┘
                              │
                              ▼
              ◇ Number of first values satisfies ◇
         No    threshold criterion? 340           Yes
      ┌───────                                        ───────┐
      ▼                                                      ▼
┌──────────────────────────┐            ┌───────────────────────────────┐
│ Report uncorrectable     │            │ Report empty page error,      │
│ data error, e.g., a real │            │ e.g., top page programmed in  │
│ decoding error.          │            │ second pass programming is    │
│         350              │            │ empty.                        │
│                          │            │         360                   │
└──────────────────────────┘            └───────────────────────────────┘
```

Perform, in response to write request with a logical address, multi-pass programming of a group of memory cells.
410

Upon receipt of read request, determine that a second logical address within read request does not match the logical address associated with data stored at a physical address of the group of memory cells.
420

Sum first data of a first pass programming to generate combined data.
430

Generate a first value via execution of an arithmetic operation over the combined data.
440

Generate difference value via comparison of first value with a second value of second data of a second pass programming.
450

Difference value satisfies threshold criterion? 460

No → Report uncorrectable data error, e.g., a real decoding error.
470

Yes → Report empty page error, e.g., top page programmed in second pass programming is empty.
480

FIG. 4

GRANULAR ERROR REPORTING ON MULTI-PASS PROGRAMMING OF NON-VOLATILE MEMORY

RELATED APPLICATIONS

The present application is a continuation of U.S. patent application Ser. No. 15/733,561, filed Aug. 27, 2020 which is a National Stage Entry for International Application No. PCT/CN2019/102055, filed Aug. 22, 2019, each of which is incorporated by reference herein.

TECHNICAL FIELD

Embodiments of the disclosure relate generally to memory sub-systems, and more specifically, relate to granular error reporting on multi-pass programming of non-volatile memory.

BACKGROUND

A memory sub-system can be a storage system, a memory module, or a hybrid of a storage device and memory module. The memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

FIG. 3 is a flow diagram of an example method to provide granular error reporting on multi-pass programming of non-volatile memory in accordance with some embodiments of the present disclosure.

FIG. 4 is a flow diagram of an example method to provide granular error reporting on multi-pass programming of non-volatile memory in accordance with other embodiments of the present disclosure.

DETAILED DESCRIPTION

Figure 1A:
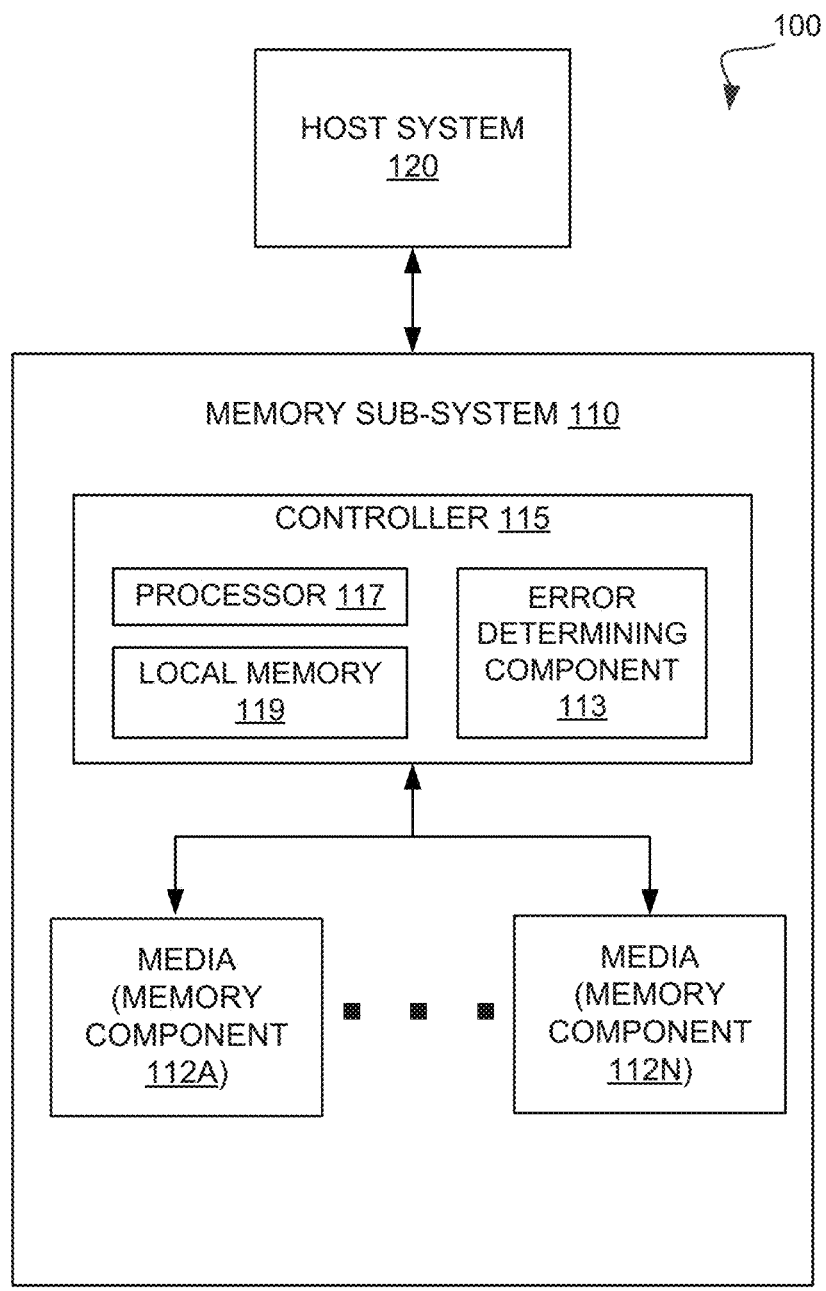
FIG. 1A illustrates an example computing environment that includes a memory sub-system in accordance with some embodiments of the present disclosure.

Aspects of the present disclosure are directed to granular and accurate error reporting on multi-pass programming of non-volatile (NVM) memory. A memory sub-system can be a storage device, a memory module, or a hybrid of a storage device and memory module. Examples of storage devices and memory modules are described below in conjunction with FIG. 1A. In general, a host system can utilize a memory sub-system that includes one or more memory components. The host system can provide data to be stored at the memory sub-system and can request data to be retrieved from the memory sub-system.

The memory sub-system can include multiple memory components that can store data from the host system. Each memory component can include a different type of media. Examples of media include, but are not limited to, a cross-point array of non-volatile memory and flash based memory such as single-level cell (SLC) memory, triple-level cell (TLC) memory, and quad-level cell (QLC) memory. The characteristics of different types of media can be different from one media type to another media type. One example of a characteristic associated with a memory component is data density. Data density corresponds to an amount of data (e.g., bits of data) that can be stored per memory cell (e.g., NAND memory cell) of a memory component. Using the example of a flash based memory, a quad-level cell (QLC) can store four bits of data while a single-level cell (SLC) can store one bit of data. Accordingly, a memory component including QLC memory cells will have a higher data density than a memory component including SLC memory cells. While the examples used herein are related to QLC memory, the principles and concepts are additionally applicable to TLC memory or other multi-level cell memory in additional embodiments.

In QLC memory, each of a group of memory cells is programmed with four bits using 16 voltage levels (for 16 states) during multi-pass programming. In a first pass programming, each of the lower page (LP), upper page (UP), and extra-logical page (XP) are programmed into the group of memory cells to complete programming of the first three bits, e.g., eight states each. In a second pass programming, a top page (TP) is programmed to complete programming of the fourth bit, and a total of eight additional states, in the same physical memory cells.

Conventionally, however, there are circumstances (such as power failure) that cause the second pass programming to fail or not complete even though the first pass programming completed and is readable. In this case, the first three bits (LP, UP, XP) have been written but not the fourth bit (TP). Compounding the problem is that error-correcting code (ECC) checks, e.g., a low density parity check (LDPC), on the written data may still pass. This is because the data read from the supposedly missing TP is an arithmetic combination of the first three bits (LP, UP, XP) that were written to the same physical locations of the memory cells during the first pass programming. Because the data does not exist, e.g., the TP is empty, when a read request is being filled to that location in the NVM memory, a second logical address in the read request will not match the logical address stored with data at a physical address of the memory component. This mismatch of addresses triggers a memory controller to detect and report to a host a decoding error, e.g., an uncorrectable data error. The firmware of the memory controller cannot tell whether this decoding error is real or not. Conventionally, therefore, the memory controller reports the decoding error and stops, causing the software program accessing the memory to hang, causing a deadlock situation. There is no solution but to perform deadlock recovery, which in some cases requires a restart of the software program, causing a disruption to the user and lost productivity.

Aspects of the present disclosure address the above and other deficiencies by providing additional granularity in error reporting that goes beyond reporting a decoding error. By providing detection and reporting of an empty page error in the above-described cases where the TP page is empty, the memory controller may trigger a restart of the write operation. The restart of the write operation may cause the host system to resend the data to be programmed properly, e.g., with an erase and write of the data to the memory component. Thus, reporting a different error than a memory decoding error may lead to a more favorable solution than recovery from a deadlock situation and a hung program.

In one embodiment, the memory component may write multiple flag bits (e.g., from a "1" to a "0") of a flag byte stored in the NVM memory in response to completion of second pass programming of the multi-pass programming. In response to a read request, the memory controller may detect that a second logical address within the read request does not match the logical address associated with a physical address of the group of memory cells. The memory controller may then do a check to determine a number of first values (e.g., ones if the write was of ones to zeros) within the plurality of flag bits. In response to the number of first values not satisfying a threshold criterion, the memory controller may report, to a host computing device, an uncorrectable data error because the TP is not empty. The threshold criterion may be that the number of first values are greater than or equal to approximately fifty percent of a number of the plurality of flag bits. If, however, the number of first values meets this threshold criterion, then the flag bits were not set upon the second pass programming and the TP is empty. In this situation, the memory controller may report an empty page error.

In an additional or alternative embodiment, particularly where the above detection results in an empty page error, the memory controller may sum first data of a first pass programming to generate combined data (e.g., LP+UP+XP). The memory controller may further calculate a second value via execution of an arithmetic operation over the combined data, e.g., resulting in (LP+UP+XP) modulo 2 in one embodiment. The memory controller may then generate a difference value via comparison of the second value with a third value of second data of a second pass programming (e.g., of the TP). The memory controller may report, to a host computing device, an empty page error in response to the difference value satisfying a threshold criterion, e.g., being less than between five and fifteen percent of a number of bits of the second value. Otherwise, if the difference value does not satisfy this threshold criterion, the memory controller may report an uncorrectable data error to the host computing device.

FIG. 1A illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1A illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells (e.g., NAND memory cells) such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 cannot include a controller 115, and may instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes an error determining component 113 that can be used for granular and accurate error reporting on multi-pass programming of non-volatile (NVM) memory as disclosed herein. In some embodiments, the controller 115 includes at least a portion of the error determining component 113. For example, the controller 115 can include a processor 117 (processing device) configured to execute instructions stored in local memory 119 for performing the operations described herein. In some embodiments, the error determining component 113 is part of the host system 120, an application, or an operating system.

The error determining component 113 can receive or detect errors associated with memory components 112A to 112N of the memory sub-system 110, and which errors can be at the granularity of one or more data blocks, e.g., a group of memory cells. The error determining component 113 can, in response to verifying a particular threshold criterion when a logical address within a read request does not match a logical address stored with data at a physical address in a memory component, report an error to the host system 120 of a particular granularity. For example, the error may be an empty page error, e.g., the TP of the second pass programming is empty, or an uncorrectable page error, e.g., there has been a true decoding error. Further details with regards to the operations of the error determining component 113 are described below.

Figure 2A:
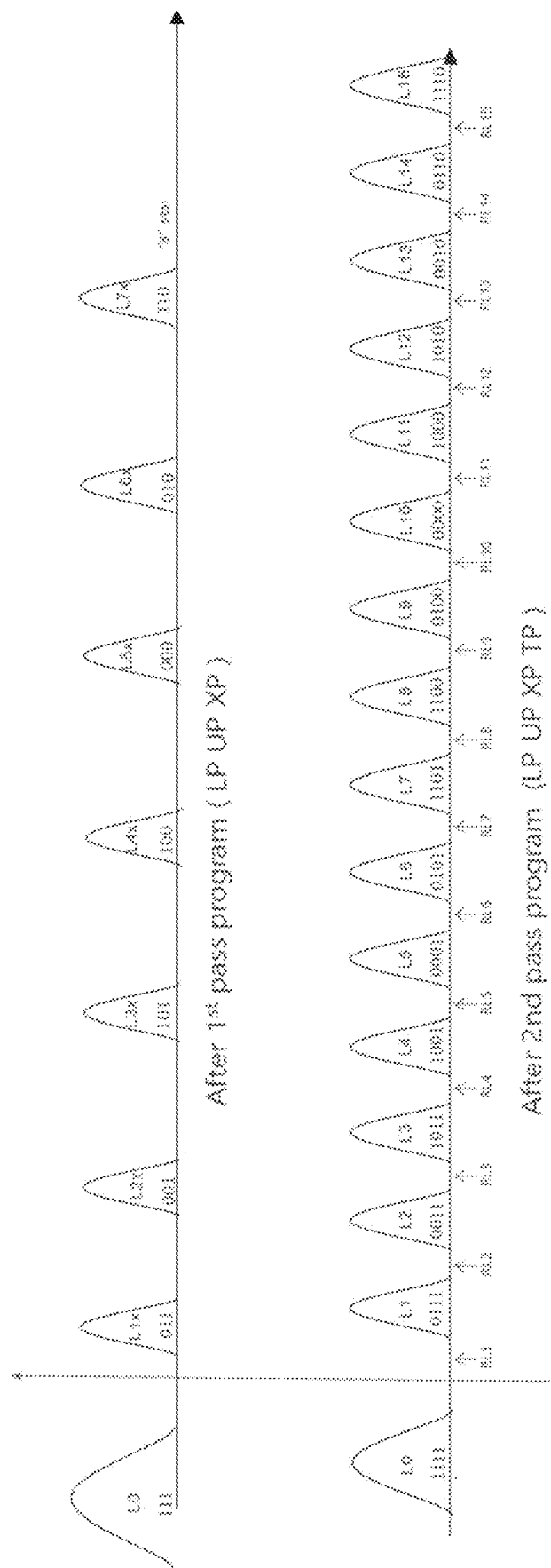
FIG. 2A is a graph that represents states programmed into a group of memory cells before and after second pass programming according to some embodiments of the present disclosure.

As discussed previously, in QLC memory, each of a group of memory cells is programmed with four bits using 16 voltage levels (for 16 states) during multi-pass programming, as illustrated in FIG. 2A. In a first pass programming, each of the lower page (LP), upper page (UP), and extra-logical page (XP) are programmed into the group of memory cells to complete programming of the first three bits, e.g., eight states each. In a second pass programming, a top page (TP) is programmed to complete programming of the fourth bit, and a total of eight additional states, in the same physical memory cells. By programming the group of states at different voltage levels in two different passes of programming, it is less likely that neighboring states—which are getting ever closer to each other with shrinking NAND memory—will be disturbed or programmed incorrectly, e.g., due to a coupling drag effect between voltage states. Accordingly, multi-pass programming of non-volatile memory reduces the number of write errors.

Conventionally, however, there are circumstances that cause the second pass programming to fail or not complete even though the first pass programming completed and is readable. The most common situation that may cause this situation is where the first pass programming completes but a power failure (or other write-related error) causes the second pass programming to not complete. In this case, the first three bits (LP, UP, XP) have been written but not the fourth bit (TP). Compounding the problem is that error-correcting code (ECC) checks, e.g., a low density parity check (LDPC), on the written data may still pass. This is because the data read from the supposedly missing TP is an arithmetic combination of the first three bits (LP, UP, XP) that were written to the same physical locations of the memory cells during the first pass programming. In one embodiment, that arithmetic combination is (LP+UP+XP) modulo two ("2"), although other combinations are envisioned. The ECC check of (LP+UP+XP) passes the same as does the ECC check of (LP+UP+XP) modulo 2 in conventional LDPC engines. In this way, although the ECC check of the write operation passes, the data is incomplete and will result in an error when a controller tries to read that data as will be explained in detail.

Figure 2B:
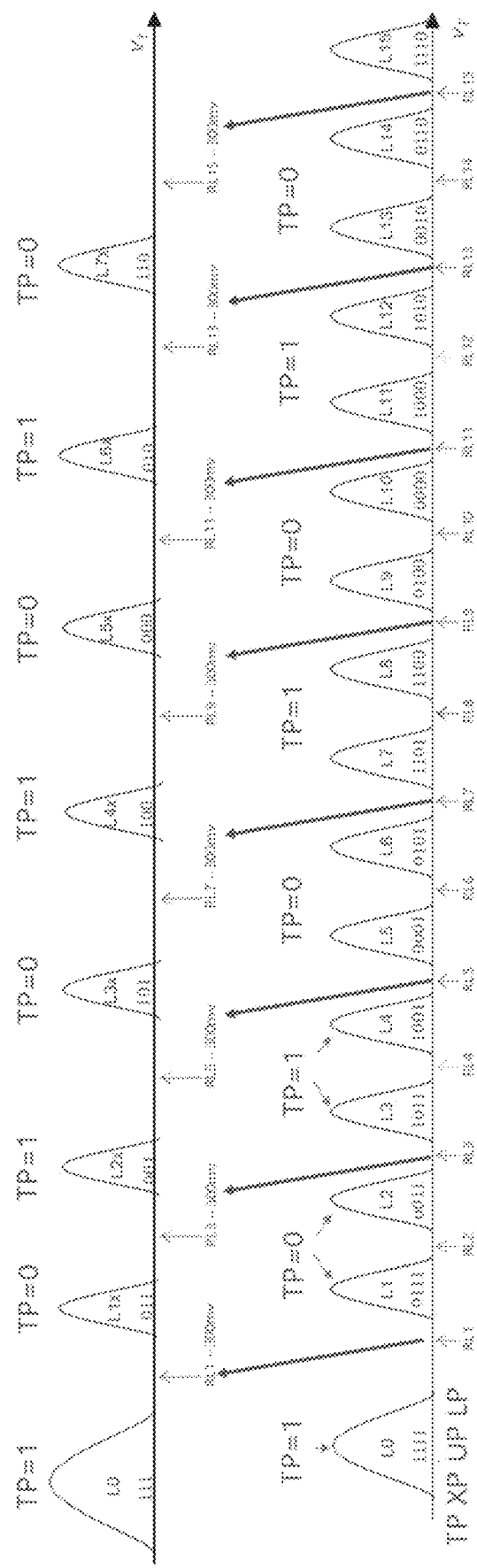
FIG. 2B is a graph that represents how second pass programming data may be read out in the event a top page is empty of data according to some embodiments of the present disclosure.

More specifically, FIG. 2B is a graph that represents how second pass programming, e.g., TP data, may be read out in the event the top page is empty of data according to some embodiments of the present disclosure. In the case of deep error handling firmware of the memory controller may adjust read levels down by about 300 millivolts. As illustrated, the data read out during a TP read where the TP data is empty includes reads at RL1, RL3, RL5, RL7, RL9, RL11, RL13, and RL15, where "RL" stands for "read level." The memory component may thus automatically assign TP data for the cells between reads based on the 16-state gray coding illustrated in Table 1, which is consistent with an arithmetic combination of the LP, UP, and XP data. For example, in one embodiment, TP'=(LP+UP+XP) modulo 2, where LP+UP+XP may be determined as a logical OR operation.

TABLE 1

| 8-State XP Bit | 8-State UP Bit | 8-State LP Bit | TP' (Read Out As:) |
|---|---|---|---|
| 1 | 1 | 1 | 1 |
| 0 | 1 | 1 | 0 |
| 0 | 0 | 1 | 1 |
| 1 | 0 | 1 | 0 |
| 1 | 0 | 0 | 1 |
| 0 | 0 | 0 | 0 |
| 0 | 1 | 0 | 1 |
| 1 | 1 | 0 | 0 |

In various embodiments, because the data does not exist, e.g., the TP is empty, and so the data and associated logical address do not exist even though the data actually read out can pass the ECC check. Accordingly, when a read request is being filled to that location in the NVM memory, a second logical address in the read request will not match the logical address associated with data stored at a physical address of the memory component, e.g., because the logical address of the TP does not exist. This mismatch of addresses triggers a memory controller (e.g., processing device) to detect (and report to a host) a decoding error, e.g., an uncorrectable data error. The firmware of the memory controller cannot tell whether this decoding error is real or not. Conventionally, therefore, the memory controller reports the decoding error and stops, causing the software program accessing the memory to hang. A software hang up may be the same result in response to a deadlock situation, e.g., where the memory controller is waiting for another process to finish its hold on the memory location while that process is waiting on the memory controller to finish its access. There is no solution but to perform deadlock recovery, which in some cases requires a restart of the software program, causing a disruption to the user and lost productivity. However, because the case of an empty TP is not a true decoding error, reporting it as such is incorrect and may lead to the worst-case scenario of hung software program(s).

Figure 1B:
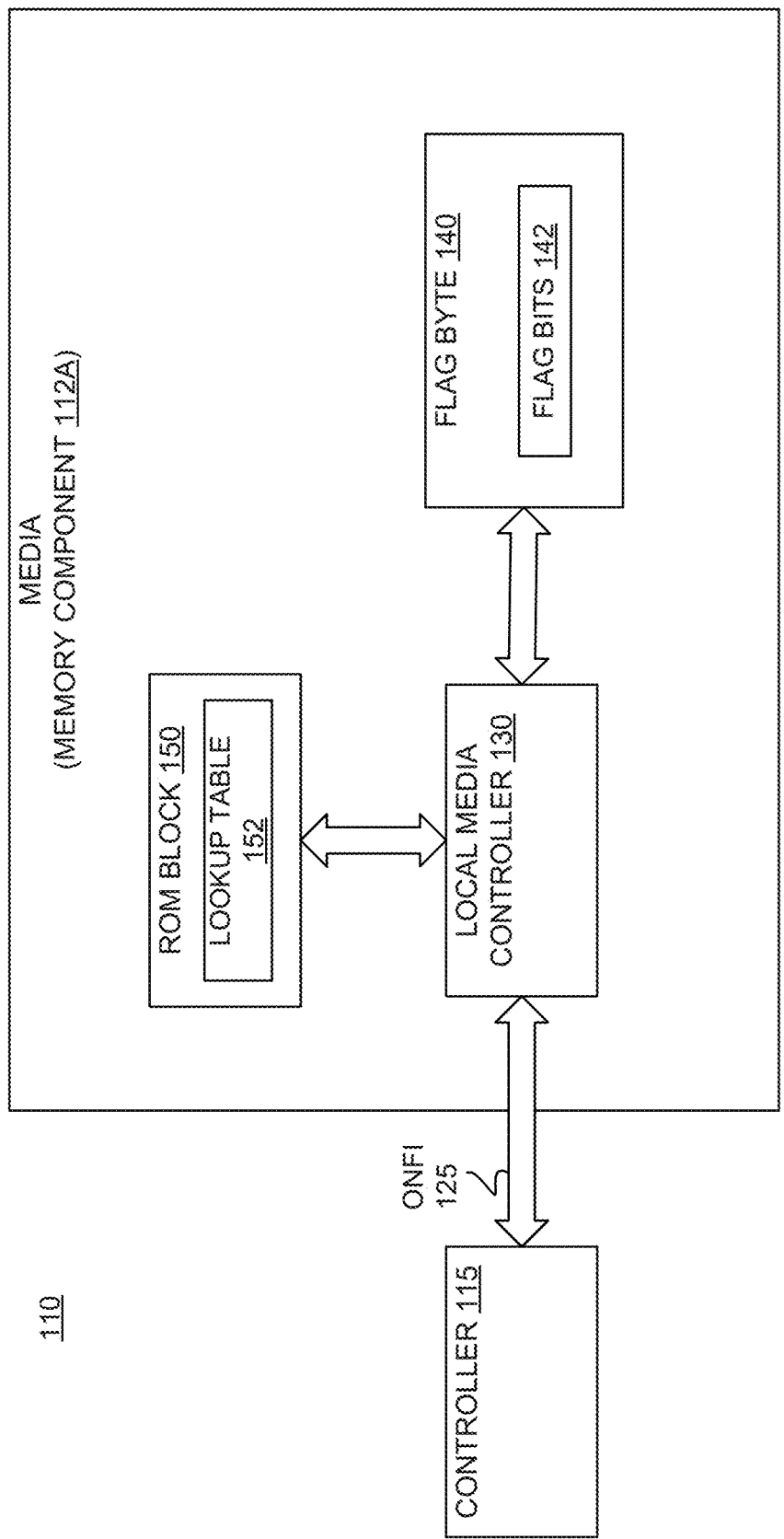
FIG. 1B is a block diagram of the memory sub-system of FIG. 1A in accordance with some embodiments of the present disclosure.

FIG. 1B is a block diagram of the memory sub-system 110 of FIG. 1A in accordance with some embodiments of the present disclosure. In embodiments, the memory sub-system 110 includes the controller 115 coupled to the memory component 112A, which is depicted as exemplary of any of the memory components 112A to 112N. The memory component 112A can include a local media controller 130, a flag byte 140 (e.g., stored within the memory cells), and a ROM block 150. In one embodiment, the flag byte 140 is a TP PROGRAMMED FLAG byte in the LP data of a group of memory cells. The local media controller 130 can couple the controller 115, the ROM block 150, and the flag byte 140 together as illustrated. In one embodiment, the local media controller 130 is to execute operations received from the controller 115 on one or more memory cells of the memory component 112A.

In one embodiment, the local media controller 130 is coupled to the controller 115 via an open NAND flash interface (ONFI) 125, which is the communication interface between the controller 115 and the memory component 112A when the controller 115 is an SSD controller and the memory component 112A is a NAND component of memory. Further, in some embodiments, the local media controller 130 is a microcontroller that includes a hardware state machine that translates commands from the ONFI interface (as sent by the controller 115) to access the memory cells. For example, the local media controller 130 can include control logic embodied as the state machine that can be generally unchangeable and that follows the commands or operations as directed by the controller 115. In the present disclosure, the state machine of the local media controller 130 is further adapted to interface with one or both of the ROM block 150 and flag byte 140 in addition to the memory cells.

In various embodiments, the flag byte 140 includes multiple flag bits 142 (e.g., 48 bits) some of which are written upon successful completion of a corresponding group of memory cells. Thus, there may be a flag byte 140 for each block of memory in the memory component 112A, each of which is not illustrated for purposes of simplicity of explanation. In response to a multi-pass programming command, the controller 115 may perform a multi-pass write to the group of memory cells. Assuming the second pass programming completes, the local media controller 130 can record such completion by writing to a number of the flag bits 142 in the flag byte 140. In one embodiment, the flag bits 142 all start as one ("1") values and, upon completion of the second pass programming of the TP, the local media controller 130 may write zero ("0") values into half or over half of the flag bits 142. In another embodiments, the flag bits 142 start as zero ("0") values and the local media controller 130 may write one ("1") values into half or over half the flag bits 142 in response to completion of the second pass programming. In this way, a threshold criterion of an empty page may be when a number of first values (whether ones in the first embodiment or zeros in the second embodiment) of the flag bits 142 is greater than a certain threshold value such as fifty percent of the flag bits 142 (e.g., 24 bits). In other words, over fifty percent of the flag bits remaining as the first value is indicative that actual data never completed being written during the second pass programming, and thus should be reported as an empty page error.

With additional reference to FIG. 1B, the ROM block 150 can be a portion of the memory cells of the memory component 112A, just reserved for system use as ROM in one embodiment. The ROM block 150 can contain a fixed data structure of configuration parameters for NAND device operation. In embodiments, the ROM block 150 may include a lookup table 152. When a write command is fulfilled and data is written to a block of memory cells, the local media controller 130 may update the lookup table 152 to create a mapping between the logical address in the write command and the physical address in the memory component 112A at which the data was written, e.g., a NAND location. Thus the lookup table 152 is variably referred to as a logical-to-physical address mapping table.

In embodiments, when a read request is later received that includes a second logical address, the local media controller 130 may access the lookup table 152 and determine the physical address in the memory component 112A. Assume the second logical address matches the logical address of the previous write command. The local media controller 130 may then retrieve, from a location in the memory component 112A corresponding to the physical address, the data and logical address that had been previously written. If this logical address (retrieved from the NAND location) does not match the second logical address in the read request, the controller 115 detects an error and reports that error to the host system 120. Conventionally, that error was a decoding error, e.g., an uncorrectable data error. But, as discussed, in cases where the error is actually due to an empty TP due to incomplete second pass programming, the controller 115 may report an empty page error to the host system 120, as will be discussed in more detail with reference to FIGS. 3-4.

FIG. 3 is a flow diagram of an example method 300 to provide granular error reporting on multi-pass programming of non-volatile memory in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the controller 115 (e.g., the error determining component 113) and/or the local media controller 130 of FIGS. 1A-1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, a memory component writes multiple flag bits within a group of memory cells in response to completion of second pass programming (e.g., of the TP) of the group of memory cells. As discussed above, these multiple flag bits may start as one values ("1s") and be changed to zero values ("0s") when written (or vice versa). If the second pass programming completed, it may write zero values to at or over fifty percent of the multiple bits, for example, or at or over sixty percent, or some other percentage depending on how many of the bits are written upon completion of the second pass programming. At operation 320, the processing logic may, upon receipt of a read request, determine that a second logical address of the read request does not match the logical address associated with data stored at a physical address of the group of memory cells. This determination conventionally resulted in a decoding error, e.g., an uncorrectable data error. Instead, however, the method 300 may perform additional diagnosis of the error to determine whether or not the error is due to an empty TP.

With additional reference to FIG. 3, at operation 330, the processing logic may determine a number of first values within the multiple flag bits, e.g., the number of one values ("1s") in the first embodiment discussed previously. For example, if the number of one values is over fifty percent of the multiple flag bits, then the second pass programming did not complete and an empty page error is the appropriate error to report. At operation 340, the processing logic may determine whether the number of first values satisfies a threshold criterion, e.g., being greater than or equal to approximately fifty percent of a number of the multiple flag bits. At operation 350, in response to the number of first values not satisfying the threshold criterion (e.g., the flag bits being less than fifty percent ones), the processing logic may report, to a host computing device, an uncorrectable data error, e.g., due to the fact that the number of flag bits indicate the second pass programming completed. At operation 360, in response to the number of first values satisfying the threshold criterion (e.g., the flag bits being greater than or equal to fifty percent ones), the processing logic may report, to the host computing device, an empty page error, e.g., that the top page programmed during the second pass programming is empty.

FIG. 4 is a flow diagram of an example method 400 to provide granular error reporting on multi-pass programming of non-volatile memory in accordance with other embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the controller 115 (e.g., the error determining component 113) and/or the local media controller 130 of FIGS. 1A-1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing logic may perform, in response to a write request with a logical address, multi-pass programming of a group of memory cells. At operation 420, upon receipt of a read request, the processing logic may determine that a second logical address within the read request does not match the logical address associated with data stored at a physical address of the group of memory cells. This determination conventionally resulted in a decoding error, e.g., an uncorrectable data error. Instead, however, the method 400 may perform additional diagnosis of the error to determine whether or not the error is due to an empty TP. The method 400 may be an additional or alternative embodiment to the method 300 of FIG. 3 to provide more granular error reporting in response to a mismatch in logical addresses.

At operation 430, the processing logic may sum first data of a first pass programming to generate combined data, e.g., of where the first data includes sub-portions of data for each of a lower page (LP), for an upper page (UP), and for an extra page (XP). The sum of the first data may be performed via a logical OR operation, for example. At operation 440, the processing logic may further generate (or calculate) a first value via execution of an arithmetic operation over the combined data. In one embodiment, the arithmetic operation is modulo N, thus the first value may be (LP+UP+XP) modulo N (where N is 2, 4, 6 or the like), or the result of some other arithmetic operation over the combination of the first data. At operation 450, the processing logic may generate a difference value via comparison of the first value with a second value of second data of a second pass programming. For example, the second value may be the data read out from an address corresponding to second pass programming for the logical address. As discussed previously, when the TP is empty, the second data read out may be the same as or similar to an arithmetic combination of the first data, e.g., a combination of LP+UP+XP. In one embodiment, the determination of the difference value may be performed with use of an XOR operation, for example.

With continued reference to FIG. 4, at operation 460, the processing logic may determine whether the difference value satisfies a threshold criterion, e.g., being less than between five and fifteen percent of a number of bits of the first value. In one embodiment, this threshold criterion may be between 500-700 bits, for example. This threshold criterion may be chosen because the second data should be approximately the same as the arithmetic operation over the combined first data when the top page is empty. As discussed above, what is therefore read out as the second data when the TP is empty may be approximately the same as (LP+UP+XP) modulo 2 in one embodiment. At operation 470, in response to the difference value not satisfying the threshold criterion, the processing logic may report an uncorrectable data error to the host computing device, e.g., that a real decoding error has occurred because the arithmetic has verified the top page is not empty. At operation 480, in response to the difference value satisfying the threshold criterion, the processing logic may report an empty page error, e.g., the top page programmed during second pass programming is empty.

The method 400 may be provided as an alternative to method 300, or may be provided as a confirmation check to the method 300 of FIG. 3. If as a confirmation check, the method 400 may be performed after the method 300 results in an empty page error, e.g., to confirm it is an empty page error before reporting the error to the host system 120. This double-check approach may be advantageous as the method 300 may be performed quickly with a single read of the multiple flag bits 142 to determine whether the second pass programming has completed. But, because the flag bits 142 are also submit to write errors, a confirmation check of method 400 may provide an ability to ensure the top page is empty before reporting the error as an empty page. The additional data reads and arithmetic steps of method 400 are more resource intensive than method 300, but would be worth the effort any additional latency to ensure the correct error is reported and that the correct action taken in response to that error.

Figure 5:
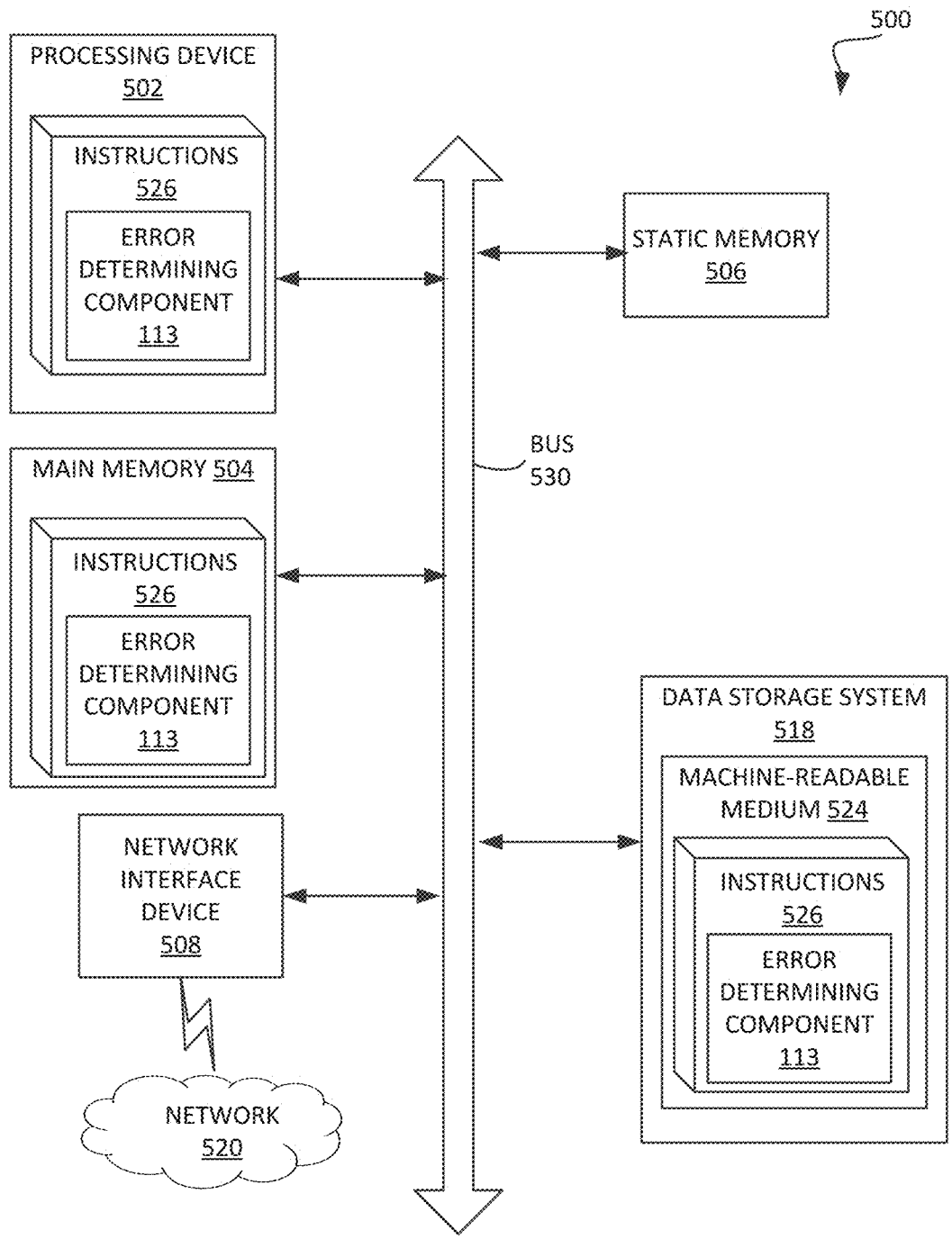
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1A) that includes, is coupled to, or utilizes a memory sub-system (e.g., the memory sub-system 110 of FIGS. 1A-1B) or can be used to perform the operations of a controller 115 (e.g., to execute an operating system to perform operations corresponding to the error determining component 113 of FIG. 1A). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIGS. 1A-1B.

In one embodiment, the instructions 526 include instructions to implement functionality corresponding to an error determining component (e.g., the error determining component 113 of FIG. 1A) or firmware of the local media controller 130. While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

The invention claimed is:

1. A system comprising:
a memory component to, upon completion of second pass programming in response to a multi-pass programming command, write a plurality of flag bits within a group of memory cells programmed by the multi-pass programming command; and
a processing device, operatively coupled to the memory component, the processing device to perform operations comprising:
detecting an error in attempting to read a top page of the group of memory cells;
determining a number of first values within the plurality of flag bits; and
in response to the number of first values not satisfying a threshold criterion, reporting, to a host computing device, an uncorrectable data error due to the top page of the group of memory cells being incompletely programmed.

2. The system of claim 1, wherein the threshold criterion comprises being greater than or equal to fifty percent of a number of the plurality of flag bits.

3. The system of claim 1, wherein, in response to the number of first values satisfying the threshold criterion, the operations further comprise reporting, to the host computing device, an empty page error that is indicative of the top page being without data.

4. The system of claim 1, wherein, in response to the number of first values satisfying the threshold criterion, the operations further comprise:
combining first data of a first pass programming to generate combined data;
generating a second value that comprises an arithmetic operation over the combined data;
generating a difference value via comparison of the second value with a third value of second data of the second pass programming; and
reporting, to the host computing device, an empty page error in response to the difference value satisfying a second threshold criterion.

5. The system of claim 4, wherein the arithmetic operation comprises modulo two.

6. The system of claim 4, wherein the operations further comprise, in response to the difference value being greater than or equal to the second threshold criterion, reporting the uncorrectable data error to the host computing device.

7. The system of claim 4, wherein the first data comprises a sub-portion of data for each of a lower page (LP), for an upper page (UP), and for an extra page (XP), and the second data comprises data of the top page (TP) programmed during the second pass programming.

8. The system of claim 4, wherein the second threshold criterion comprises being less than between five and fifteen percent of a number of bits of the second value.

9. A method comprising:
performing, in response to a write request with a logical address, multi-pass programming of a group of memory cells of a memory component;
writing, in response to completion of second pass programming of the multi-pass programming, a plurality of flag bits within the group of memory cells;
detecting an error in attempting to read a top page of the group of memory cells;
determining a number of first values within the plurality of flag bits; and
in response to the number of first values satisfying a threshold criterion, reporting, to a host computing device, an empty page error that is indicative of the top page being incompletely programmed during the second pass programming.

10. The method of claim 9, wherein the threshold criterion comprises being greater than or equal to fifty percent of a number of the plurality of flag bits, the method further comprising, in response to the number of first values not satisfying the threshold criterion, reporting, to the host computing device, an uncorrectable data error.

11. The method of claim 9, further comprising, before reporting the empty page error, confirming that the top page is empty by:
    combining first data of a first pass programming to generate combined data;
    generating a second value via executing an arithmetic operation over the combined data;
    generating a difference value via comparison of the second value with a third value of second data programmed in the top page; and
    determining that the difference value does not satisfy a second threshold criterion.

12. The method of claim 11, wherein executing the arithmetic operation comprises calculating modulo two of the combined data.

13. The method of claim 11, further comprising, in response to determining the difference value satisfies the second threshold criterion, reporting an uncorrectable data error to the host computing device.

14. The method of claim 11, wherein the second threshold criterion comprises being less than between five and fifteen percent of a number of bits of the second value.

15. The method of claim 11, wherein the first data comprises a sub-portion of data for each of a lower page (LP), for an upper page (UP), and for an extra page (XP).

16. A system comprising:
    a memory component; and
    a processing device, operatively coupled to the memory component, the processing device to perform operations comprising:
        performing, in response to a write request comprising a logical address, multi-pass programming of a group of memory cells of the memory component;
        detecting an error in attempting to read a top page of the group of memory cells; and
        in response to the detecting:
            summing first data of a first pass programming to generate combined data;
            generating a first value via execution of an arithmetic operation over the combined data;
            generating a difference value via comparison of the first value with a second value of second data of a second pass programming; and
            reporting, to a host computing device, an empty page error in response to the difference value satisfying a threshold criterion.

17. The system of claim 16, wherein the arithmetic operation comprises modulo two.

18. The system of claim 16, wherein the operations further comprise, in response to the difference value not satisfying the threshold criterion, reporting an uncorrectable data error to the host computing device.

19. The system of claim 16, wherein the first data comprises sub-portions of data for each of a lower page (LP), for an upper page (UP), and for an extra page (XP), and the second data comprises data of the top page (TP) programmed during the second pass programming.

20. The system of claim 16, wherein the threshold criterion comprises being less than between five and fifteen percent of a number of bits of the first value.

* * * * *